United States Patent
Haney et al.

(10) Patent No.: US 9,974,181 B2
(45) Date of Patent: May 15, 2018

(54) MODULE WITH EXTERNAL SHIELD AND BACK-SPILL BARRIER FOR PROTECTING CONTACT PADS

(71) Applicant: Avago Technologies General IP (Singapore) Pte. Ltd., Singapore (SG)

(72) Inventors: Sarah Haney, San Jose, CA (US); Deog Soon Choi, Seoul (KR); Hyun Mo Ku, Seoul (KR); Lea-Teng Lee, Sunnyvale, CA (US); Nitesh Kumbhat, San Jose, CA (US); Ah Ron Lee, Seoul (KR)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 0 days. days.

(21) Appl. No.: 15/079,070

(22) Filed: Mar. 24, 2016

(65) Prior Publication Data
US 2017/0280561 A1 Sep. 28, 2017

(51) Int. Cl.
| H05K 7/00 | (2006.01) |
|---|---|
| H05K 1/18 | (2006.01) |
| H05K 1/11 | (2006.01) |
| H01L 23/552 | (2006.01) |
| H01L 25/065 | (2006.01) |

(52) U.S. Cl.
CPC ............ *H05K 1/181* (2013.01); *H01L 23/552* (2013.01); *H01L 25/0655* (2013.01); *H05K 1/111* (2013.01); *H01L 2924/15321* (2013.01); *H01L 2924/15322* (2013.01);
(Continued)

(58) Field of Classification Search
CPC ........... H01L 2924/3025; H01L 23/552; H01L 2225/06537; H01L 25/0655; H01L 2924/15321; H01L 2924/15322; H01L 2924/15323; H05K 1/0218; H05K 1/0215; H05K 2201/1056; H05K 9/0024; H05K 9/003; H05K 1/181; H05K 1/111; H05K 2201/10371
USPC ........ 361/728, 799, 800, 816, 818; 174/350, 174/50.59
See application file for complete search history.

(56) References Cited

U.S. PATENT DOCUMENTS

| 5,894,167 A | 4/1999 | Moden et al. |
| 7,898,066 B1 | 3/2011 | Scanlan et al. |
| (Continued) | | |

FOREIGN PATENT DOCUMENTS

CN 104868872 A 8/2015

OTHER PUBLICATIONS

Co-pending U.S. Appl. No. 14/920,798, filed Oct. 22, 2015.
Co-pending U.S. Appl. No. 15/054,208, filed Feb. 26, 2016.

*Primary Examiner* — James Wu

(57) ABSTRACT

A module includes a printed circuit board (PCB) having a substrate, component pads on a top surface of the substrate, and contact pads formed on a bottom surface of the substrate. The module further includes a mold compound disposed over the PCB; an external shield disposed over a top surface of the mold compound and on side surfaces of the mold compound and the PCB, where the external shield is configured to provide shielding of at least one component connected to at least one component pad from electromagnetic radiation; and a back-spill barrier formed on the bottom of the substrate. The back-spill barrier surrounds the contact pads, and is configured to prevent the external shield from making contact with the contact pads.

20 Claims, 6 Drawing Sheets

(52) U.S. Cl.
CPC ............... *H01L 2924/15323* (2013.01); *H01L 2924/3025* (2013.01); *H05K 2201/10371* (2013.01)

(56) References Cited

U.S. PATENT DOCUMENTS

| | | | |
|---|---|---|---|
| 8,350,367 B2* | 1/2013 | Chiu | H01L 21/568 257/659 |
| 2005/0013082 A1* | 1/2005 | Kawamoto | H01L 24/16 361/118 |
| 2008/0210462 A1* | 9/2008 | Kawagishi | H01L 21/561 174/377 |
| 2009/0027864 A1* | 1/2009 | Cho | H05K 3/3452 361/767 |
| 2010/0013077 A1* | 1/2010 | Shin | H01L 23/3192 257/690 |
| 2011/0095418 A1* | 4/2011 | Lim | H01L 23/3128 257/737 |
| 2013/0063917 A1 | 3/2013 | Choi et al. | |

* cited by examiner

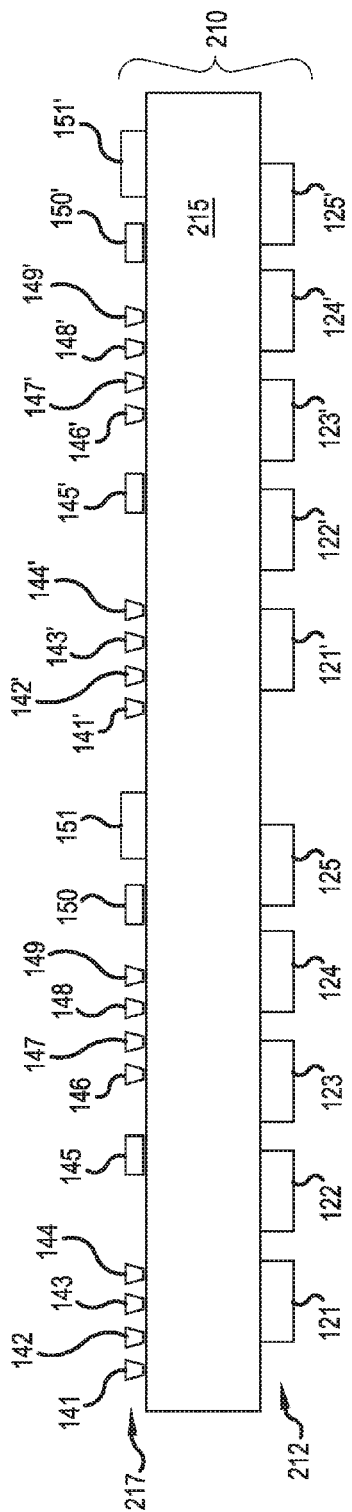
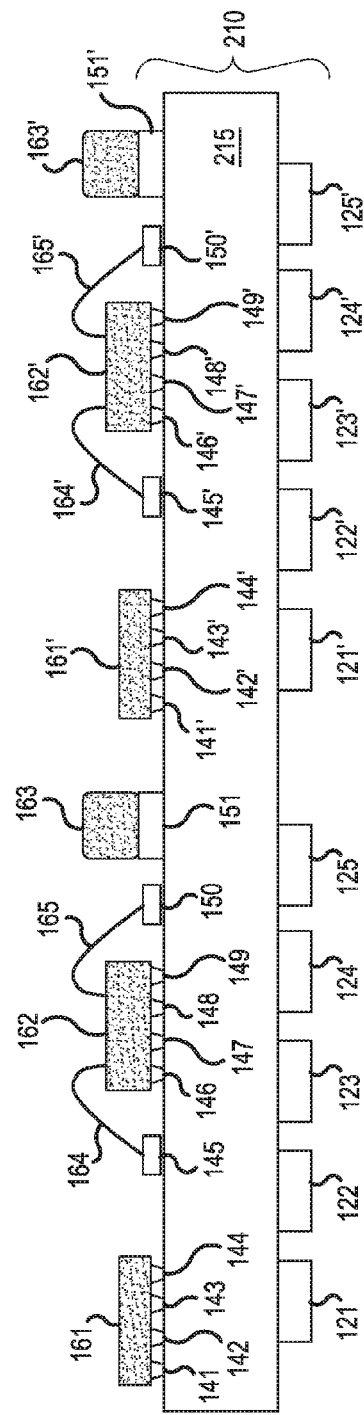
FIG.2A
FIG.2B

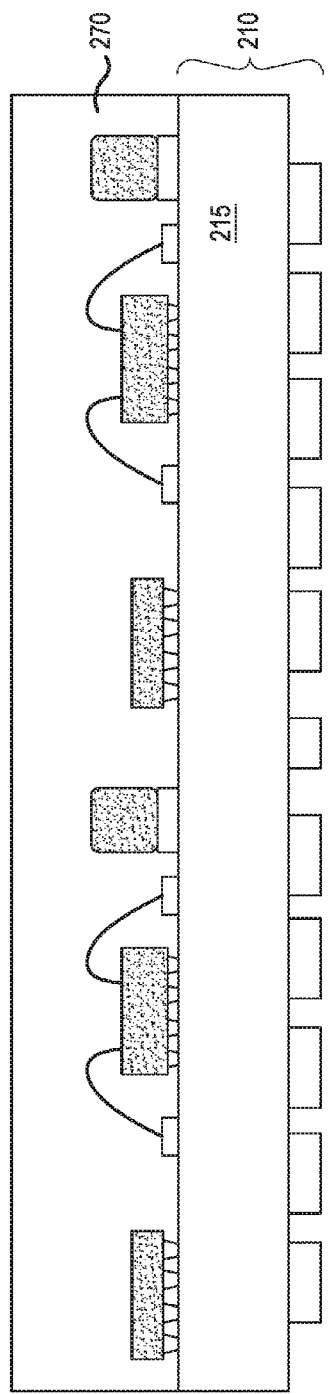
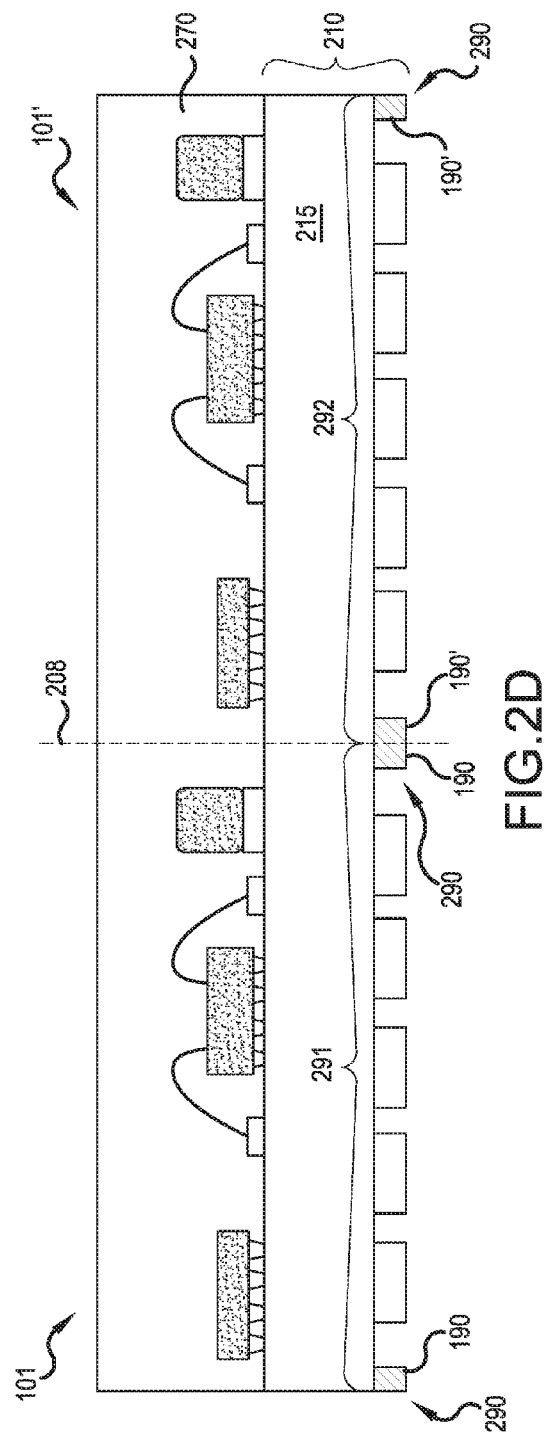

MODULE WITH EXTERNAL SHIELD AND BACK-SPILL BARRIER FOR PROTECTING CONTACT PADS

BACKGROUND

Small electronic components, including amplifiers, filters, transducers and the like, are employed in a number of devices, particularly in radio frequency (RF) wireless communications, for example. Various types of filters, for example, include acoustic filters, such as surface acoustic wave (SAW) resonator devices containing SAW resonators, and bulk acoustic wave (BAW) resonator devices containing thin film bulk acoustic resonators (FBARs) and solidly mounted resonators (SMRs), for example.

Conventionally, the electronic components on and/or in printed circuit boards (PCBs) are combined in circuit packages and covered with external shields to form discrete shielded packages, referred to as "modules." The external shields are generally shield layers that cover top and sidewalls of the circuit packages, and provide protection against externally generated electromagnetic radiation ("external electromagnetic radiation"), that may cause electromagnetic interference (EMI), as well as some protection against environmental stresses, such as temperature, humidity and physical impact, for example. That is, to reduce effects of electromagnetic radiation, the circuit package is coated with an electrically conductive shield material layer which is grounded externally or internally to create the shield that is conformal to circuit package. In order to provide protection against the external electromagnetic radiation, the external shield is formed of electrically conductive material, typically metal. The bottom of a circuit package, though, is typically not shielded by the external shield, since the substrate of the PCB itself, together with external connecting pins and pads arranged on the bottom of the substrate and/or various electronic components, transmission lines and other circuitry within the substrate generally provide some external shielding from external electromagnetic radiation. The external shield layers together with the bottom shielding together provide a "global shield" for the module.

For example, the conformal external shield is intended for shielding the circuit package on five sides, but not the sixth side (with the connecting pins/pads), where the conformal externals shield may short to signal pins/pad. However, depending upon coating method and package structure, there is a tendency for the conformal external shield to partially coat the sixth side with overflow around the side edges, which may be referred to as "back-spill."

Accordingly, there is a need for enhanced shielding among and between electronic components within a shielded circuit package or module, which does not unduly restrict design freedom with regard to placement of the electronic components, size of the module and other features.

BRIEF DESCRIPTION OF THE DRAWINGS

The illustrative embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements throughout the drawings and written description.

FIGS. 2A to 2F are simplified cross-sectional views showing an illustrative method of fabricating modules respectively including circuit packages, external shields and back-spill barriers, according to a representative embodiment.

DETAILED DESCRIPTION

Figure 1A:
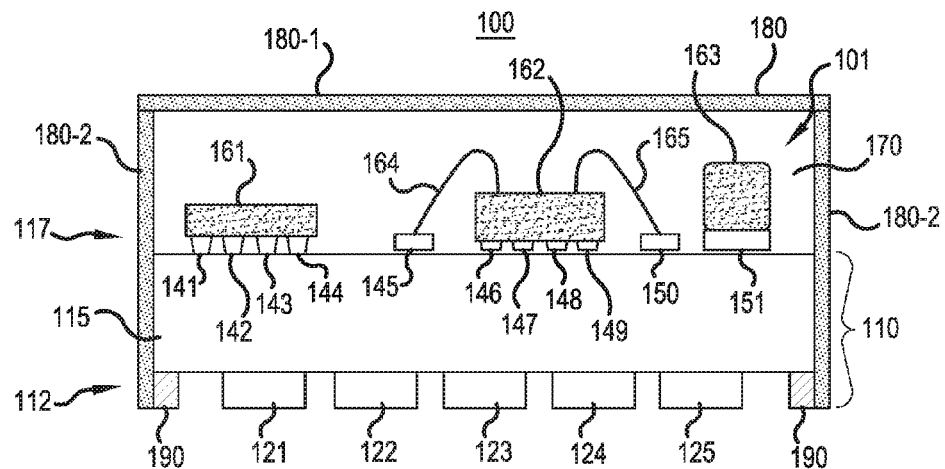
FIG. 1A is a simplified cross-sectional view of a module including a circuit package, external shield and back-spill barrier, according to a representative embodiment.

In the following detailed description, for purposes of explanation and not limitation, example embodiments disclosing specific details are set forth in order to provide a thorough understanding of the present teachings. However, it will be apparent to one of ordinary skill in the art having the benefit of the present disclosure that other embodiments according to the present teachings that depart from the specific details disclosed herein remain within the scope of the appended claims. Moreover, descriptions of well-known apparatuses and methods may be omitted so as to not obscure the description of the example embodiments. Such methods and apparatuses are clearly within the scope of the present teachings.

The terminology used herein is for purposes of describing particular embodiments only, and is not intended to be limiting. The defined terms are in addition to the technical, scientific, or ordinary meanings of the defined terms as commonly understood and accepted in the relevant context.

The terms "a", "an" and "the" include both singular and plural referents, unless the context clearly dictates otherwise. Thus, for example, "a device" includes one device and plural devices. The terms "substantial" or "substantially" mean to within acceptable limits or degree. The term "approximately" means to within an acceptable limit or amount to one of ordinary skill in the art. Relative terms, such as "above," "below," "top," "bottom," "upper" and "lower" may be used to describe the various elements' relationships to one another, as illustrated in the accompanying drawings. These relative terms are intended to encompass different orientations of the device and/or elements in addition to the orientation depicted in the drawings. For example, if the device were inverted with respect to the view in the drawings, an element described as "above" another element, for example, would now be below that element. Where a first device is said to be connected or coupled to a second device, this encompasses examples where one or more intermediate devices may be employed to connect the two devices to each other. In contrast, where a first device is said to be directly connected or directly coupled to a second device, this encompasses examples where the two devices are connected together without any intervening devices other than electrical connectors (e.g., wires, bonding materials, etc.).

In various representative embodiments, a module may include multiple electronic components on or buried within a substrate of a PCB. A bottom surface of the substrate includes an array of pins or an array of contact pads, such as land grid array (LGA) pads, ball grid array (BGA) pads, die grid array (DGA) pads or pin grid array (PGA) pads, for example, which provide mechanical, thermal and/or electrical connection to other circuitry, such as a mother board. The module includes an external shield to reduce or eliminate EMI with the electronic components that would be caused by external electromagnetic radiation. The external shield is formed of a layer of electrically conductive material (e.g., copper (Cu) or other metal) consisting of sputtered, sprayed or plated particles. As mentioned above, the electrically conductive material may spread across the bottom of the substrate along the edges, and come into contact with one or more of signal pins or signal contact pads, causing electrical short. (The electrically conductive material may also contact ground pins or ground contact pads, although no shorting would result since the external shield is already grounded.)

Thus, according to representative embodiments, the module includes a back-spill fence or back-spill barrier applied around the pins or contact pads (e.g., formed around an outer perimeter of the bottom surface of the substrate) to prevent the external shield from interconnecting with or otherwise contacting the pins or contact pads. This achieves a high quality conformal external shield, with a reduced error rate of undesired electrical connections caused by spillover.

According to another representative embodiment, a module includes a PCB having a substrate, component pads on a top surface of the substrate, and contact pads formed on a bottom surface of the substrate. The module further includes a mold compound disposed over the PCB; an external shield disposed over a top surface of the mold compound and on side surfaces of the mold compound and the PCB, where the external shield is configured to provide shielding of at least one component connected to at least one component pad from electromagnetic radiation; and a back-spill barrier formed on the bottom of the substrate. The back-spill barrier surrounds the contact pads, and is configured to prevent the external shield from making contact with the contact pads.

Figure 1B:
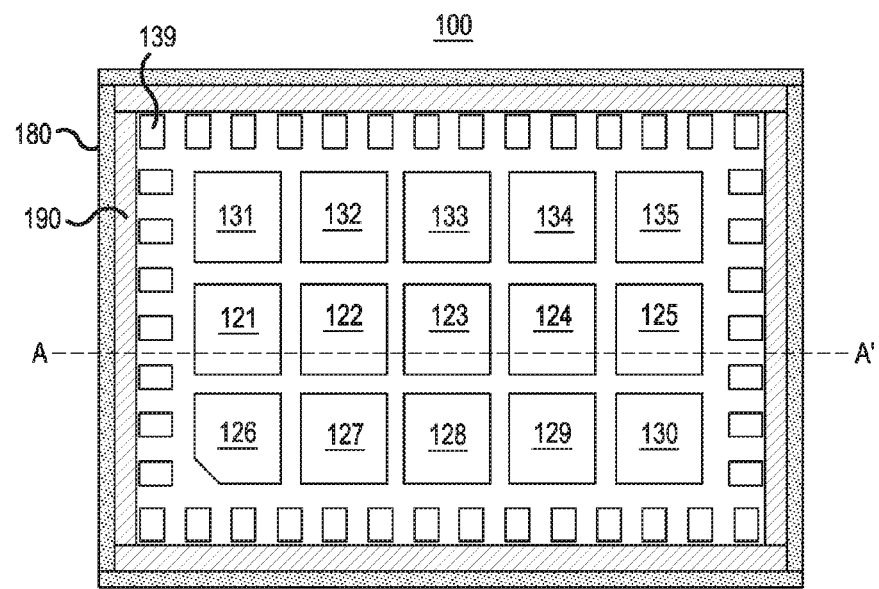
FIG. 1B is a bottom plan view of the module shown in FIG. 1A, according to a representative embodiment.

FIG. 1A is a simplified cross-sectional view of a module including a circuit package, external shield and back-spill barrier, and FIG. 1B is a bottom plan view of the module shown in FIG. 1A, according to a representative embodiment. The cross-sectional view of the module shown in FIG. 1A is taken along line A-A' of FIG. 1B, Referring to FIGS. 1A and 1B, module 100 includes a printed circuit board (PCB) 110 comprising a patterned bottom metal layer 112, a substrate 115 (which may have embedded circuitry (not shown)), and a patterned top metal layer 117. The PCB 110 may further include a ground layer (not shown), which may be included in the substrate 115, for example. The substrate 115 may be formed of any material compatible with semiconductor processes, such as silicon (Si), gallium arsenide (GaAs), indium phosphide (InP), glass, sapphire, alumina, epoxy, bismaleimide triazine (BT), prepreg composites, reinforced or non-reinforced polymer dielectrics and the like, for example.

The patterned bottom metal layer 112 includes representative contact pads 121-135 arranged on a bottom (first) surface of the substrate 115, each of the contact pads 121-135 may be a signal contact pad configured to transmit electrical signals. The contact pads 121-135 may be LGA pads, for example, although other types of contact pads, such as BGA pads and DGA pads, and/or pins may be incorporated without departing from the scope of the present teachings. The contact pads 121-135 are arranged in an array of three rows and five columns, for purpose of illustration. In addition, the bottom metal layer 112 includes ground pads, indicated by representative ground pad 139, surrounding the contact pads 121-135. In alternative configurations, one or more of the contact pads 121-135 may likewise be ground contact pads, without departing from the scope of the present teachings. The contact pads 121-135 and the ground pads 139 may be formed of any conductive material compatible with semiconductor processes, such as gold (Au), silver (Ag), aluminum (Al) or copper (Cu), for example.

The patterned top metal layer 117 includes representative component pads 141-151 arranged on a top (second) surface of the substrate 115, opposite the bottom surface. It is understood that the component pads 141-151 may include alternative numbers and arrangements, depending on design and configuration requirements. For purposes of illustration, representative electronic components include a flip chip die (or flip chip integrated circuit) 161 mounted to the component pads 141-144, a wirebond die 162 mounted to the component pads 146-149, and a surface mount technology (SMT) component 163 mounted to the component pad 151. Wirebonds 164 and 165 are attached between the wirebond die 162 and the component pads 145 and 150, respectively. Although FIGS. 1A and 1B show the module 100 as having three components, the flip chip die 161, the wirebond die 162 and the SMT component 163, it is understood that a module may contain different numbers and/or types of electronic components, without departing from the scope of the present teachings. Examples of other components that may be mounted to the surface (or embedded within) the substrate 115 include power amplifiers, filters, transducers, complementary metal-oxide semiconductor (CMOS) circuits, integrated silicon-on-insulator (SOI) circuits and the like, although the various embodiments are not limited to these examples.

The component pads 141-151 may be formed of any conductive material compatible with semiconductor processes, such as gold (Au), silver (Ag), aluminum (Al) or copper (Cu), for example. In various configurations, the module 100 may also include one or more internal shields between components mounted on or within the PCB 110 to provide protection against internally generated electromagnetic radiation ("internal electromagnetic radiation") caused by other components, that may also result in EMI. Examples of internal shields are described by Kumbhat et al., U.S. patent application Ser. No. 14/920,798 (filed Oct. 22, 2015), published as U.S. Patent App. Pub. No. 2017/0117229 (Apr. 27, 2017), and Jeong et al., U.S. patent application Ser. No. 15/054,208 (filed Feb. 26, 2016), published as U.S. Patent App. Pub. No. 2017/0251576 (Aug. 31, 2017), which are hereby incorporated by reference in their entireties.

A mold compound 170 is disposed over the top surface of the PCB 110, the flip chip die 161, the wirebond die 162 and the SMT component 163, to form a circuit package 101. The mold compound 170 may be formed of a reinforced or non-reinforced epoxy resin, for example, generally protecting the flip chip die 161, the wirebond die 162 and the SMT component 163, and providing additional structural support to the module 100. In various embodiments, the mold compound 170 may hermetically seal the flip chip die 161, the wirebond die 162 and the SMT component 163 within the module 100.

An external shield 180 is disposed over the outer surfaces of the circuit package 101 (that is, the outer surfaces of the mold compound 170 and the PCB 110). For example, the external shield 180 include a top conductive layer 180-1 applied to a top surface of the mold compound 170, and side conductive layers 180-2 applied to side surfaces of the mold compound 170 and the PCB 110. The top and side conductive layers 180-1 and 180-2 may be conformal layers, thereby forming the conformal external shield 180. In the depicted embodiment, the top conductive layer 180-1 covers the one top surface and the side conductive layers 180-2 cover the four side surfaces, so the external shield 180 covers five of the six surfaces of the circuit package 101. The top and side conductive layers 180-1 and 180-2 are formed of a conductive material (e.g., metal), such as copper (Cu), silver (Ag), gold (Au), aluminum (Al) and/or stainless steel, for example, or a combination of conductive and non-conductive materials, and electrically grounded. For example, the external shield 180 may be electrically connected to a ground layer (not shown) in the PCB 110.

The conductive material may be applied to the circuit package 101 using a variety of processes, such as sputtering, spraying and/or electrolytic or electroless plating, without departing from the scope of the present teachings. As stated above, the external shield protects the module components (e.g., the illustrative flip chip die 161, wirebond die 162 and SMT component 163) from external electromagnetic radiation. In addition, the external shield may also provide protection of the module components from various environmental stresses, such as temperature, moisture and physical impact.

Figure 1C:
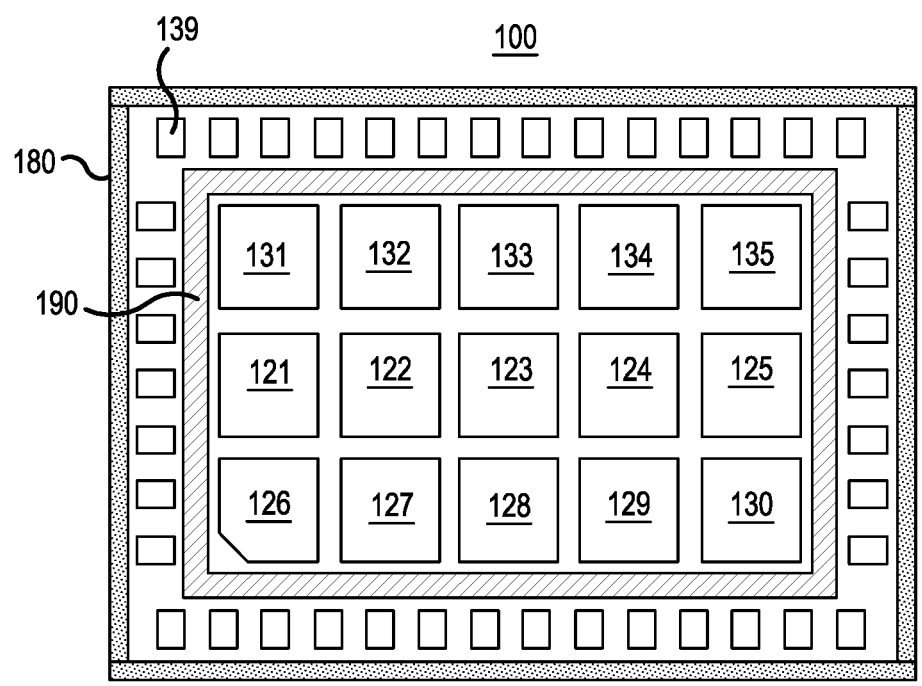
FIG. 1C is a bottom plan view of a module including a circuit package, external shield and back-spill barrier, according to another representative embodiment.

The module 100 further includes a back-spill barrier 190 formed on the bottom surface of the substrate 115. The back-spill barrier 190 surrounds at least the (signal) contact pads 121-135 to prevent overflow of the conductive material (back-spill) of the side conductive layers 180-2 onto the contact pads during formation of the external shield 180. In the depicted embodiment, the back-spill barrier 190 is formed along the outer perimeter of the substrate 115. However, alternative embodiments are not limited to this configuration. For example, the back-spill barrier 190 may be formed further toward the middle of the substrate 115 and thus away from the outer edges of the substrate 115. Or, as shown in the representative embodiment shown in FIG. 1C, the back-spill barrier 190 may be formed between the outer ground pads 139 (which are unaffected by contact made by back-spill) and the inner signal pads, e.g., the contact pads 121-135. Also, the back-spill barrier 190 may be formed on fewer than all of the edges of the substrate 115.

The back-spill barrier 190 may be formed of various electrically non-conductive dielectric materials compatible with semiconductor processes, such as photo-imagible dielectric material and curable ink, including ultra-violet (UV) curable ink. The photo-imagible dielectric material may include, for example, photo-imagible solder resist (PSR) that comprises film or liquid solder resist. However, the back-spill barrier 190 is not limited to electrically non-conductive materials, and may include, for example, a copper (Cu) pattern dam. An electrically conductive back-spill barrier 190 may be separately grounded, or grounded through contact with the side conductive layers 180-2 of the external shield 180. Of course, an electrically conductive back-spill barrier 190 could not contact any signal contacts pads from among the contact pads 121-135, or else shorting may result.

FIGS. 2A to 2F are simplified cross-sectional views showing an illustrative method of fabricating modules respectively including circuit packages, external shields and back-spill barriers, according to a representative embodiment.

Figure 2E:
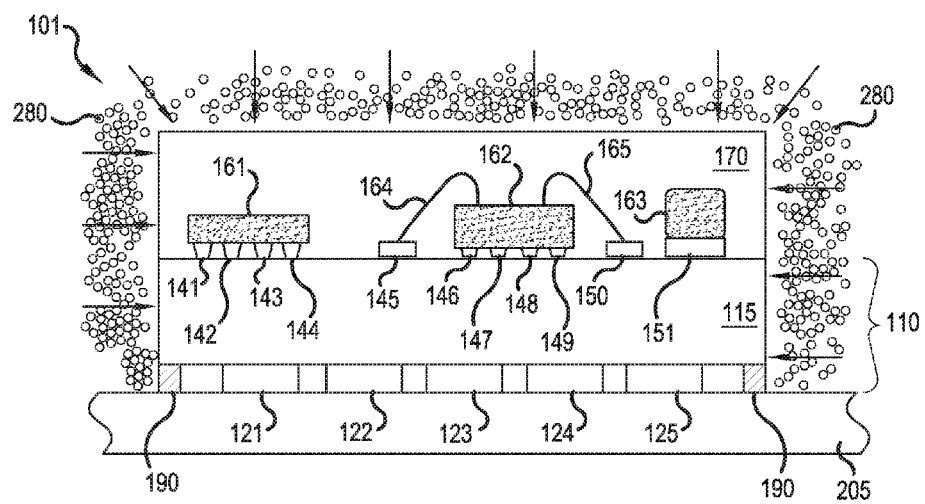

Referring to FIG. 2A, a base PCB panel 210 and electrical circuitry are provided. That is, the base PCB panel 210 comprises a patterned bottom metal layer 212, a base substrate 215, and a patterned top metal layer 217. The base PCB panel 210 is configured ultimately to be divided into multiple circuit packages with back-spill barriers, to which external shields are subsequently applied to form individual modules (e.g., modules 100, 100'), as discussed below with reference to FIGS. 2D to 2F. The base substrate 215 may be formed of any material compatible with semiconductor processes, such as silicon (Si), gallium arsenide (GaAs), indium phosphide (InP), glass, sapphire, alumina, epoxy, bismaleimide triazine (BT), prepreg composites, reinforced or non-reinforced polymer dielectrics and the like, for example. Internal electronic circuitry (not shown) may be included in the base substrate 215, such as internal metal layers (e.g., signal and/or ground layers), traces and/or vias interconnecting various internal metal layers, to provide unique benefits for any particular situation or to meet application specific design requirements of various implementations, without departing from the scope of the present teachings.

The patterned bottom metal layer 212 and the patterned top metal layer 217 may be fabricated at substantially the same time. For example, electroless copper (Cu) may be plated as a blanket film on the bottom and top surfaces of the base substrate 215. Photo resist may then be applied to both the bottom and top copper (Cu) plating, and exposed to create openings corresponding to desired shapes and locations of the representative contact pads 121-125 and 121'-125' and component pads 141-151 and 141'-151' (as well as additional pads not visible in the cross-sectional view of FIG. 2A). The pads are electrolytically plated on both sides of the base substrate 215 where the electroless copper (Cu) is exposed (in the photo resist open areas). The photo resist is stripped, and the thin electroless copper (Cu) layer is etched from all surfaces, leaving the outer layer copper (Cu) pads. That is, the outer layer copper (Cu) pads include the representative contact pads 121-125 and 121'-125' and the representative component pads 141-151 and 141'-151'. The contact pads 121-125 and 121'-125' may be signal contact pads configured to transmit electrical signals, and may be LGA pads, for example, although other numbers and types of contact pads, such as BGA pads and DGA pads, and/or pins may be incorporated without departing from the scope of the present teachings.

Referring to FIG. 2B, flip chip dies 161 and 161' are attached to the component pads 141-144 and 141'-144', respectively. The flip chip dies 161 and 161' may be attached using any compatible attachment method, such as placing copper pillars on one surface of the flip chip dies 161 and 161' on solder balls applied to the component pads 141-144 and 141'-144', respectively, and reflowing the solder. In addition, wirebond dies 162 and 162' are attached to the component pads 146-149 and 146'-149', respectively. The SMT components 163 and 163' are attached to the component pads 151 and 151', respectively. The SMT components 163 and 163' may be attached using any compatible attachment method, such as placing the SMT components 163 and 163' on solder balls applied to the component pads 151 and 151', respectively, and reflowing the solder. The wirebond dies 162 and 162' may be attached using any compatible attachment method, such as soldering, described above. Further, wirebonds 164 and 165 are attached between the wirebond die 162 and the component pads 145 and 150, respectively, and wirebonds 164' and 165' are attached between the wirebond die 162' and the component pads 145' and 150', respectively, using any compatible attachment method, such as soldering. Notably, since the wirebond dies 162 and 162' are (electrically) connected to the patterned top metal layer 217 by the pairs of wirebonds 164, 165 and 164', 165', respectively, the connections via the component pads 144-149 and 144'-149', respectively, need not be electrical connections, but rather just mechanical and/or thermal connections, without departing from the scope of the present teachings.

Referring to FIG. 2C, mold compound 270 is disposed over the base PCB panel 210 and the electronic components arranged thereon (e.g., the flip chip dies 161 and 161', the wirebond dies 162 and 162', and the SMT components 163 and 163'). The mold compound 270 may be formed of a reinforced or non-reinforced epoxy resin, for example, and may be applied using any process compatible with fabrication of semiconductor devices, such as injection molding, transfer molding, or compression molding, for example. In various embodiments, the mold compound 270 may be applied in a liquid or viscous state, and then allowed to set to provide the solid mold compound 270. The mold compound 270 generally protects the electronic components and provides additional structural support.

Referring to FIG. 2D, a back-spill barrier grid 290 is formed on the bottom surface of the base substrate 215. The back-spill barrier grid 290 includes multiple barrier grid portions, each of which surrounds a different set of (signal) contact pads on the bottom surface of the base substrate 215. For example, in the depicted embodiment, the back-spill barrier grid 290 includes a first portion 291 that surrounds at least the contact pads 121-125, and a second portion 292 that surrounds at least the contact pads 121'-125'.

The combination of the mold compound 270, base PCB panel 210 and back-spill barrier grid 290 is then singulated along line 208 to provide multiple circuit packages, e.g., indicated by representative circuit packages 101 and 101' in the depicted embodiment. After singulation, the first portion 291 of the back-spill barrier grid 290 becomes back-spill barrier 190 arranged along an outer perimeter of the circuit package 101, and the second portion 292 of the back-spill barrier grid 290 becomes back-spill barrier 190' arranged along an outer perimeter of the circuit package 101'. In addition, the circuit package 101 includes the flip chip die 161, the wirebond die 162 and the SMT component 163, and circuit package 101' includes the flip chip die 161', the wirebond die 162' and the SMT component 163'.

The back-spill barrier grid 290 (and thus the subsequently divided back-spill barriers 190 and 190') may be formed of various electrically non-conductive dielectric materials compatible with semiconductor processes, such as PSR, including film or liquid solder resist, UV curable ink, and non-curable ink. Using PSR, the bottom of the PCB panel 210, including the contact pads 121-125 and 121'-125', is covered with a solder mask of solder resist material. In the depicted embodiment (e.g., as shown in FIG. 1B), the middle portion of the solder resist material is developed out in accordance with the sold mask. This exposes the contact pads 121-125 and 121'-125', while leaving the back-spill barrier grid 290 in place, resulting in back-spill barriers 190 and 190' formed of solder resist material arranged along the outer perimeters of the circuit packages 101 and 101', respectively, as discussed above.

Using ink, the bottom of the PCB panel 210, including the contact pads 121-125 and 121'-125', is be covered with a screen material having the pattern of the back-spill barrier grid 290 printed on it. The ink is applied to the screen, such that it prints only on those areas corresponding to the pattern, resulting in application of the back-spill barrier grid 290, and subsequently the back-spill barriers 190 and 190', as raised ink lines arranged along the outer perimeters of the circuit packages 101 and 101', respectively. When UV curable ink is used, the resulting ink pattern is exposed to UV light until it sets. Non-curable ink is simply allowed to dry (or set) over time. An ink jet process may alternatively be used, which involves using a printing head to print the ink in the desired locations of the back-spill barriers 190 and 190'.

As mentioned above, the back-spill barrier grid 290 (and the back-spill barriers 190 and 190') is not limited to electrically non-conductive materials. For example, the back-spill barrier grid 290 may be formed of copper (Cu) pattern dam. To form a copper (Cu) pattern dam, the bottom of the PCB panel 210, including the contact pads 121-125 and 121'-125', is covered with a mask that defines openings over the bottom of the PCB panel 210 where the copper (Cu) is to be applied. In the depicted embodiment, the openings would be along the outer perimeters of the circuit packages 101 and 101', respectively, as discussed above. Thus, upon removal of the mask, the contact pads 121-125 and 121'-125' are exposed and the portions of the back-spill barrier grid 290 respectively surrounding the contact pads 121-125 and 121' are copper (Cu) dams. In alternative embodiments, dams may be formed of other conductive materials, such as silver (Ag), gold (Au), aluminum (Al), for example, without departing from the scope of the present teachings.

Figure 2F:
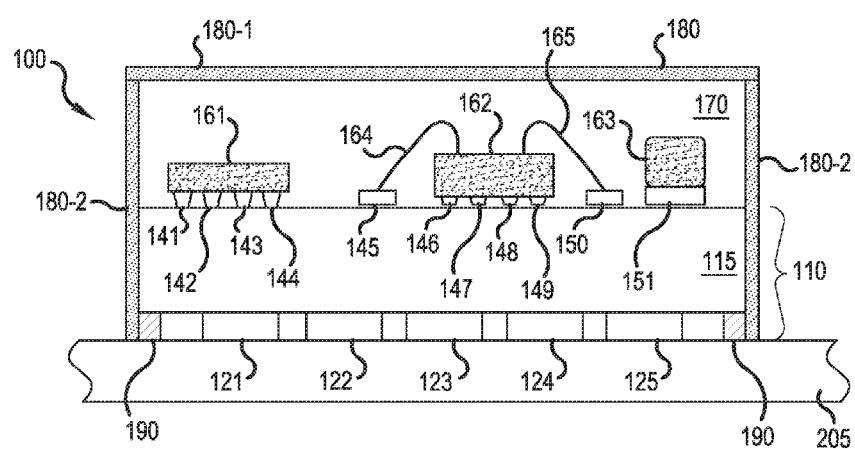

Referring to FIGS. 2E and 2F, after the combined mold compound 270, base PCB panel 210 and back-spill barrier grid 290 has been singulated along line 208, the separated circuit packages 101 and 101' are placed in series on a module carrier 205, which transports the circuit packages 101 and 101' through the conductive layer coating process to form an external shield (180) on each of the circuit packages 101 and 101' individually. For ease of illustration, only the circuit package 101 is shown in FIGS. 2E and 2F, although it is understood that the same conductive layer coating process is performed, sequentially, on the circuit package 101' (as well as any other circuit packages that may have originated with the base PCB panel 210 and singulated along with the circuit packages 101 and 101').

As shown in FIG. 2E, conductive material 280 is sputtered onto five of the six outer surfaces of the circuit package 101 (i.e., the top surface and the four side surfaces, where the front and back surfaces are not shown in the cross-sectional view of FIG. 2E) to form the external shield 180, as shown in FIG. 2F. The sputtering process is indicted by arrows pointing from the conductive material 280 toward the outer surfaces of the circuit package 101. The conductive material 280 may be any compatible material capable of blocking electromagnetic radiation when formed as the external shield 180 upon completion of the sputtering process, thus preventing EMI. Such materials may include copper (Cu), silver (Ag), gold (Au), aluminum (Al) and/or stainless steel, for example, although other materials may be incorporated. In alternative embodiments, spraying or plating (electrolytic or electroless) processes may be used in place of sputtering to apply the conductive material 280 to the top and side outer surfaces of the circuit package 101, without departing from the scope of the present teachings.

Notably, the back-spill barrier 190 formed on the bottom surface of the substrate 115 blocks the conductive material 280 from back spilling beneath the substrate 115, or otherwise coming into contact with any of the contact pads 121-125, as shown in FIG. 2E. This results in the side conductive layers 180-2 of the external shield 180 being formed adjacent the outer edge of the back-spill barrier 190, as shown in FIG. 2F. In an embodiment, the top conductive layer 180-1 of the external shield 180 may have a thickness of about 0.1 μm to about 50 μm, and the side conductive layers 180-2 of the external shield 180 may have a thickness of about 0.1 μm to about 50 μm, for example, although other thicknesses and combinations of thicknesses may be incorporated without departing from the scope of the present teachings.

Figure 3:
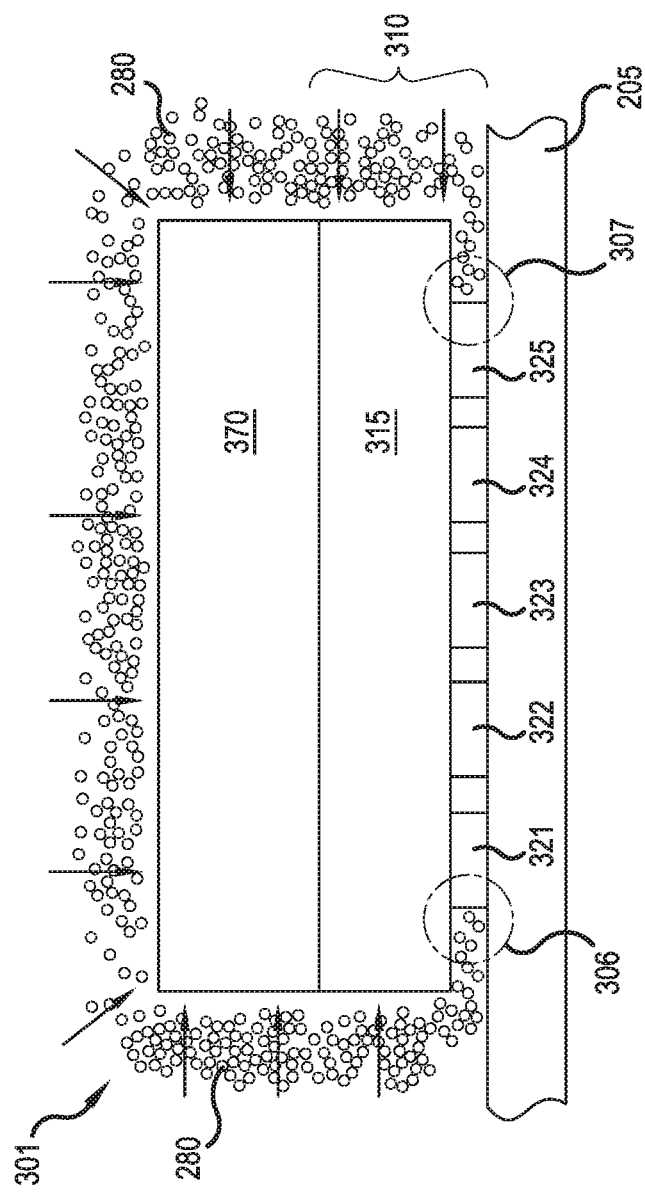
FIG. 3 is a simplified cross-sectional view of a conventional method of fabricating an external shield on a module.

FIG. 3 is a simplified cross-sectional view of a conventional method of fabricating an external shield on a module, for purposes of comparison. Referring to FIG. 3, a previously singulated circuit package 301 is placed on module carrier 205 for a sputtering operation, for example. During the sputtering operation, conductive material 280 is sputtered onto five of the six outer surfaces of the circuit package 301, as discussed above. The circuit package 301 includes mold compound 370 and PCB 310, and the PCB 310 includes a substrate 215 and contact pads 321-325 on a bottom surface of the substrate 315. Component pads and corresponding components may be arranged on a top surface of the substrate 315, although they are not shown in FIG. 3 for simplicity of explanation.

As shown, there is no back-spill barrier on the bottom surface of the substrate 315. Accordingly, the contact pads 321-325 are exposed to the conductive material 280 as it is sputtered onto side surfaces of the circuit package 301. As indicated by circles 306 and 307, this arrangement enables the conductive material 280 to come into physical and/or electrical contact with at least the outer most contact pads 321 and 325. Accordingly, when an external shield is formed upon completion of the sputtering operation, it may short the contact pads 321 and 325 to ground (assuming that the contact pads 321 and 325 are signal pads), along with any other signal contact pads with which the back-spilled conductive material 280 comes into contact. Such overflow of conductive material, and ensuing contact and electrical shorting, is prevented the back-spill barrier (e.g., back-spill barrier 190) arranged on the bottom surface of the PCB substrate (e.g., substrate 115) in the embodiments set forth herein.

The various components, structures and parameters are included by way of illustration and example only and not in any limiting sense. In view of this disclosure, those skilled in the art can implement the present teachings in determining their own applications and needed components, materials, structures and equipment to implement these applications, while remaining within the scope of the appended claims.

What is claimed:

1. A module, comprising:
   a printed circuit board (PCB) including a substrate, a plurality of component pads on a top surface of the substrate, and a plurality of signal contact pads formed on a bottom surface of the substrate, and a plurality of ground contact pads formed on the bottom surface of the substrate and arranged in rows along each edge of the substrate, thereby surrounding the plurality of signal contact pads;
   a mold compound disposed over the PCB;
   an external shield disposed over a top surface of the mold compound and on side surfaces of the mold compound and the PCB, a portion of the external shield extending past the bottom surface of the substrate, wherein the external shield is configured to provide shielding of at least one component connected to at least one component pad of the plurality of component pads from electromagnetic radiation; and
   a back-spill barrier formed on the bottom surface of the substrate between the plurality of ground contact pads and the portion of the external shield extending past the bottom surface of the substrate, thereby surrounding the plurality of signal contact pads on the bottom surface of the substrate, wherein the back-spill barrier is physically spaced apart from the plurality of signal contact pads along the bottom surface of the substrate, and prevents the external shield from making contact with the signal contact pads.

2. The module of claim 1, wherein the back-spill barrier is formed substantially along an outer perimeter of the bottom surface of the substrate.

3. The module of claim 1, wherein the back-spill barrier comprises film photo-imagible solder resist (PSR) material.

4. The module of claim 1, wherein the back-spill barrier comprises liquid photo-imagible solder resist (PSR) material.

5. The module of claim 1, wherein the at least one component connected to the at least one component pad comprises at least one of a flip chip die, a wirebond die and a surface mount technology (SMT) component.

6. A module, comprising:
   a circuit package comprising an array of signal contact pads or signal pins on a bottom surface of a substrate in the circuit package, and ground contact pads or ground pins on the bottom surface of the substrate surrounding the array of the signal contact pads or signal pins;
   an external shield disposed over top and side surfaces of the circuit package, the external shield being electrically connected to ground, thereby providing shielding of the circuit package from external electromagnetic radiation; and
   a back-spill barrier formed along the bottom surface of the substrate of the circuit package, surrounding the array of the signal contact pads or signal pins, wherein the back-spill barrier is positioned between the array of the signal contact pads or signal pins and the ground contact pads or ground pins, and the ground contact pads or ground pins are positioned between the back-spill barrier and the external shield, the back-spill barrier preventing electrically conductive material of the external shield from contacting the signal contact pads or signal pins during formation of the external shield.

7. The module of claim 6, wherein the back-spill barrier comprises photo-imagible dielectric material.

8. The module of claim 6, wherein the back-spill barrier comprises curable ink.

9. The module of claim 6, wherein the back-spill barrier comprises a copper (Cu) pattern dam.

10. The module of claim 6, wherein the signal contact pads comprise land grid array (LGA) pads.

11. The module of claim 6, wherein the signal contact pads comprise a ball grid array (BGA) or a die grid array (DGA), and wherein the signal pins comprise a pin grid array (PGA).

12. The module of claim 6, wherein the external shield is electrically connected to ground.

13. The module of claim 12, wherein the substrate comprises a ground terminal, and the external shield is electrically connected to ground through connection to the ground terminal.

14. The module of claim 12, wherein the external shield comprises copper (Cu) or silver (Ag).

15. The module of claim 6, wherein the back-spill barrier comprises film photo-imagible solder resist (PSR) material.

16. The module of claim 6, wherein the back-spill barrier comprises liquid photo-imagible solder resist (PSR) material.

17. A module, comprising:
a printed circuit board (PCB) including a substrate, and land grid array (LGA) signal pads and ground pads formed on a first surface of the substrate;
a mold compound disposed over a second surface of the substrate, opposite the first surface of the substrate;
a conductive metal layer disposed on the mold compound and on side surfaces of the PCB, wherein the conductive metal layer is electrically connected to ground, thereby providing shielding from electromagnetic radiation; and
a back-spill barrier formed on the first surface of the substrate around the LGA signal pads,
wherein the back-spill barrier is positioned between the LGA signal pads and the ground pads, which are positioned between the back-spill barrier and the conductive metal layer, and wherein the back-spill barrier is spaced apart from the LGA signal pads along the first surface of the substrate, preventing the conductive metal layer from contacting the LGA signal pads.

18. The module of claim 17, wherein the back-spill barrier comprises photo-imagible solder resist (PSR) material.

19. The module of claim 17, wherein the back-spill barrier comprises ultra-violet (UV) curable ink.

20. The module of claim 17, wherein the back-spill barrier comprises a copper (Cu) pattern dam.

* * * * *